(12) United States Patent
Walker (10) Patent No.: US 11,411,556 B2
(45) Date of Patent: Aug. 9, 2022

(54) DUTY CYCLE CONTROL FOR SWITCHING POWER CONVERTERS

(71) Applicant: Astec International Limited, Kowloon (HK)

(72) Inventor: Carl Kenneth Walker, Taipei (TW)

(73) Assignee: Astec International Limited, Kowloon (HK)

( * ) Notice: Subject to any disclaimer, the term of this patent is extended or adjusted under 35 U.S.C. 154(b) by 0 days.

(21) Appl. No.: 16/938,063

(22) Filed: Jul. 24, 2020

(65) Prior Publication Data
US 2022/0029613 A1    Jan. 27, 2022

(51) Int. Cl.
| H02M 3/335 | (2006.01) |
| H03K 7/08 | (2006.01) |
| H02M 3/157 | (2006.01) |
| H02M 1/00 | (2006.01) |

(52) U.S. Cl.
CPC ............ *H03K 7/08* (2013.01); *H02M 3/157* (2013.01); *H02M 3/3353* (2013.01); *H02M 1/0025* (2021.05)

(58) Field of Classification Search
CPC .......... H02M 3/3353; H02M 3/33546; H02M 3/33569; H02M 1/0025; H03K 7/08
See application file for complete search history.

(56) References Cited

U.S. PATENT DOCUMENTS

| 6,833,635 B2 * | 12/2004 | Kippley | H02J 1/10 307/83 |
| 7,116,087 B2 | 10/2006 | Zhang et al. | |
| 9,929,653 B1 | 3/2018 | Mercer et al. | |
| 10,090,763 B1 * | 10/2018 | Mercer | H02M 3/158 |
| 2011/0298514 A1 * | 12/2011 | Hopkins | H02M 1/0845 327/176 |
| 2012/0032660 A1 * | 2/2012 | Nakamura | H02M 3/156 323/288 |
| 2013/0038301 A1 | 2/2013 | Ouyang et al. | |
| 2016/0118887 A1 * | 4/2016 | Zhang | H02M 7/4837 323/271 |
| 2016/0329809 A1 * | 11/2016 | Granato | H02M 3/158 |
| 2018/0166991 A1 | 6/2018 | Tateishi | |

FOREIGN PATENT DOCUMENTS

CN    102377342 B    8/2015

OTHER PUBLICATIONS

Extended European Search Report for EP Application No. 21186927. 6, dated Dec. 7, 2021, 10 pages.

* cited by examiner

*Primary Examiner* — Harry R Behm (57) ABSTRACT

A switching power converter includes a power circuit including at least two power switching devices and a control circuit coupled to the power circuit for controlling the power switching devices. The control circuit is configured to sense an output voltage of the power circuit, generate at least two ramp signals based on complementary clock signals, and generate a control signal for controlling one of the power switching devices based on one of the ramp signals and the output voltage of the power circuit, and another control signal for controlling another one of the power switching devices based on another one of the ramp signals and the output voltage of the power circuit. In some examples, the control circuit may include comparators for generating the control signals. Other example power converters and control circuits are also disclosed.

10 Claims, 6 Drawing Sheets

DUTY CYCLE CONTROL FOR SWITCHING POWER CONVERTERS

FIELD

The present disclosure relates to duty cycle control for switching power converters.

BACKGROUND

This section provides background information related to the present disclosure which is not necessarily prior art.

Electric power converters commonly include a power circuit and a control circuit for controlling switching devices in the power circuit. The control circuit may include a comparator for generating control signals to control the switching devices. In such examples, the control circuit may generate a compensation signal by adding a ramp signal and a sensed output voltage of the power circuit, and an error signal based on a reference voltage and the sensed output voltage. The comparator then compares the compensation signal and the error signal to generate the control signals. The ramp signal is commonly generated based on an equivalent series resistance (ESR) of an output capacitor or a volt-seconds product of an output inductor in the power circuit.

SUMMARY

This section provides a general summary of the disclosure, and is not a comprehensive disclosure of its full scope or all of its features.

According to one aspect of the present disclosure, a switching power converter includes a power circuit having at least two power switching devices and a control circuit coupled to the power circuit for controlling the power switching devices. The control circuit is configured to sense an output voltage of the power circuit, generate at least two ramp signals based on complementary clock signals, and generate a first control signal for controlling one of the power switching devices based on one of the ramp signals and the output voltage of the power circuit, and a second control signal for controlling another one of the power switching devices based on another one of the ramp signals and the output voltage of the power circuit.

According to another aspect of the present disclosure, a control circuit for controlling power switching devices of a power circuit is disclosed. The control circuit includes comparators. The control circuit is configured to sense an output voltage of the power circuit, and generate at least two ramp signals based on complementary clock signals. One of the comparators is configured to generate a first control signal for controlling one of the power switching devices based on a comparison between one of the ramp signals and the output voltage of the power circuit, and another one of the comparators is configured to generate a second control signal for controlling another one of the power switching devices based on a comparison between another one of the ramp signals and the output voltage of the power circuit.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding (but not necessarily identical) parts and/or features throughout the several views of the drawings.

DETAILED DESCRIPTION

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments will now be described more fully with reference to the accompanying drawings.

Figure 1:
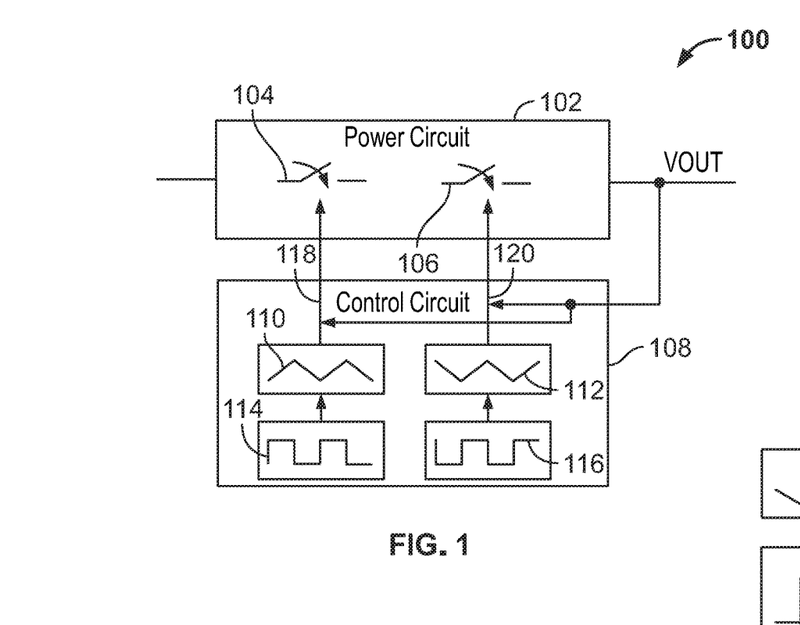
FIG. 1 is a block diagram of a switching power converter including a power circuit and a control circuit for generating PWM control signals based on ramp signals and clock signals to control power switching devices in the power circuit according to one example embodiment of the present disclosure.

A switching power converter according to one example embodiment of the present disclosure is illustrated in FIG. 1 and indicated generally by reference number 100. As shown in FIG. 1, the switching power converter 100 includes a power circuit 102 having two power switching devices 104, 106, and a control circuit 108 coupled to the power circuit 102 for controlling the power switching devices 104, 106. The control circuit 108 senses an output voltage Vout of the power circuit 102, generates ramp signals 110, 112 based on complementary clock signals 114, 116, and generates control signals 118, 120 for controlling the power switching devices 104, 106 based on the ramp signals 110, 112, respectively, and the output voltage Vout.

The control circuit 108 and/or any one of the other control circuits disclosed herein simplifies the control scheme of a power converter and reduces computing stress as compared to a conventional control circuit. For example, a control circuit is often tasked with controlling a power converter to provide stringent load profiles. In such examples, the power converter is often digitally controlled with a high-performance microcontroller employing complex control algorithms and sensing techniques for controlling pulse-width modulation (PWM) to ensure the converter complies with the stringent load profiles and provides clean, error-free power under changing load conditions (e.g., increased full load current, peak power, load current slew rates, etc.). This may increase computing stress on the microcontroller, and strain on engineering resources. However, by controlling PWM based on a sensed (e.g., sampled) output voltage and ramp signals as disclosed herein, computing stress on the microcontroller and strain on engineering resources may be reduced as compared to a conventional control circuit relying a microcontroller to control PWM.

As explained above, the clock signals 114, 116 are complementary to each other. For example, and as shown in FIG. 1, when the clock signal 114 is high, the clock signal 116 is low, and when the clock signal 114 is low, the clock signal 116 is high. In such examples, the clock signals 114, 116 may be 180 degrees out of phase with respect to each other.

Additionally, in some examples dead time may be placed between transitions of the complementary clock signals 114, 116. In such examples, dead time is placed between a transition (e.g. low to high and/or high to low) of the clock signal 114 and a transition (e.g. high to low and/or low to high) of the clock signal 116. This may prevent a condition where both clock signals 114, 116 are high at the same time causing both control signals 118, 120 to turn on their corresponding power switching devices 104, 106.

In some examples, the clock signals 114, 116 may set the frequency of the control signals 118, 120. For example, and as further explained below, the clock signals 114, 116 may be used to directly control the switching frequency of the control signals 118, 120 (e.g., PWM control signals) at a fixed value. In such examples, the frequency of the control signals 118, 120 may be adjusted by changing a parameter of the clock signals 114, 116. In other examples, the frequency of the control signals 118, 120 may be set and/or adjusted using other suitable components, techniques, etc.

In the example of FIG. 1, the clock signals 114, 116 may be generated and/or controlled in different manners. For example, the control circuit 108 may include a microcontroller for generating and/or controlling the clock signals 114, 116. In some examples, the control circuit 108 may include one or more clock generators such as oscillator circuits for generating and/or controlling the complementary clock signals 114, 116. In such examples, the microcontroller, clock generators, etc. may adjust the frequency and/or duty cycle of the clock signals 114, 116 to change the PWM control signals 118, 120 to accommodate for various operating conditions of the power circuit 102 (and/or the power converter 100), as further explained below.

As shown in FIG. 1, the ramp signals 110, 112 are clock-driven triangular waveforms. For example, the ramp signal 110 increases (or decreases) while the ramp signal 112 decreases (or increases). Specifically, and as shown in FIG. 1, the ramp signal 110 increases when the clock signal 114 is high, and decreases when the clock signal 114 is low. Similarly, the ramp signal 112 increases when the clock signal 116 is high, and decreases when the clock signal 116 is low. In such examples, the rate at which the ramp signals 110, 112 increase and decrease are equal and based on the complementary clock signals 114, 116.

In the example of FIG. 1, the ramp signals 110, 112 may be generated with various components. For example, the positive-going and negative-going portions of the ramp signals 110, 112 may be generated with one or more current sources, capacitors, and/or other components commonly employed to generate ramp signals.

The control signals 118, 120 may be adjusted for different operating conditions. For example, it may be desirable to regulate the output voltage Vout at a defined value. In such examples, the duty cycle of the PWM control signals 118, 120 may be controlled based on the generated ramp signals 110, 112 (e.g., reference voltage signals) and the sensed output voltage Vout to ensure the output is regulated. If an operating condition of the power converter 100 changes (e.g., a change in load conditions, output regulation, etc.), the control circuit 108 may adjust the frequency and/or duty cycle of the clock signals 114, 116. As a result, the frequency and/or duty cycle of the PWM control signals 118, 120, which are generated based on the clock signals 114, 116, may be adjusted as well. As such, the power converter 100 may quickly adapt to changing operating conditions.

In some examples, the PWM control signals 118, 120 may be generated based on comparisons between the ramp signals 110, 112 and the output voltage Vout. In such examples, the control circuit 108 (and/or any other control circuit disclosed herein) may include one or more comparators for comparing generated ramp signals and the output voltage.

Figure 2:
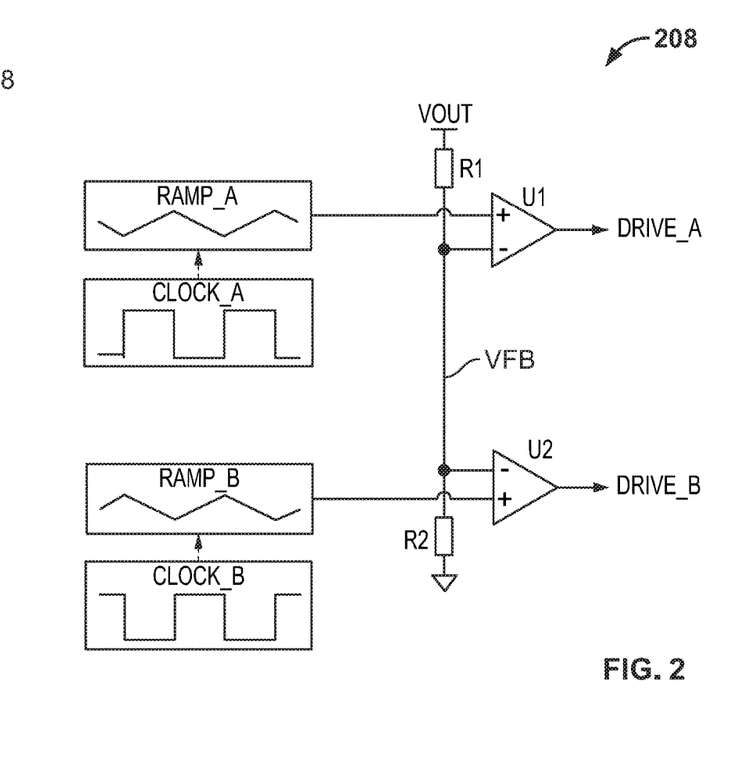
FIG. 2 is a schematic diagram of a control circuit including comparators for generating PWM control signals based on ramp signals to control power switching devices in a power circuit according to another example embodiment.

For example, FIG. 2 illustrates a control circuit 208 employable with the power circuit 102 of FIG. 1. The control circuit 208 of FIG. 2 is substantially similar to the control circuit 108 of FIG. 1, but includes comparators U1, U2 for generating PWM control signals DRIVE_A, DRIVE_B.

As shown in FIG. 2, the control circuit 208 senses an output voltage Vout of a power circuit (e.g., the power circuit 102 of FIG. 1). In the particular example of FIG. 2, the control circuit 208 includes a voltage divider formed by resistors R1, R2 for reducing the sensed output voltage Vout to a desired level. The reduced output voltage is referred to as a feedback signal VFB, and is provided to the comparators U1, U2.

Additionally, the control circuit 208 generates ramp signals RAMP_A, RAMP_B based on complementary clock signals CLOCK_A, CLOCK_B, respectively, as explained above. For example, the control circuit 208 may include one or more microcontrollers, clock generators, etc. for generating and/or controlling the clock signals CLOCK_A, CLOCK_B. As shown in FIG. 2, the ramp signals RAMP_A, RAMP_B include positive slopes when the clock signals CLOCK_A, CLOCK_B are high and negative slops when the clock signals CLOCK_A, CLOCK_B are low.

The comparators U1, U2 generate the PWM control signals DRIVE_A, DRIVE_B based on comparisons between the ramp signals RAMP_A, RAMP_B and the feedback signal VFB. Specifically, and as shown in FIG. 2, the comparator U1 compares the ramp signal RAMP_A and the feedback signal VFB, and generates the PWM control signal DRIVE_A. Likewise, the comparator U2 compares the ramp signal RAMP_B and the feedback signal VFB, and generates the PWM control signal DRIVE_B. In such examples, the duty cycles of the PWM control signals DRIVE_A, DRIVE_B may be controlled based on the generated ramp signals RAMP_A, RAMP_B (e.g., reference voltage signals) and the sensed output voltage Vout to ensure the output is regulated. For example, the peak-to-peak voltage of the ramp signals RAMP_A, RAMP_B may be adjusted to change the duty cycles of the PWM control signals DRIVE_A, DRIVE_B.

The PWM control signals DRIVE_A, DRIVE_B of FIG. 2 may be generated without relying on error signals and/or error amplifiers. For example, and as shown in FIG. 2, the feedback signal VFB and the ramp signals RAMP_A, RAMP_B (e.g. reference signals) are applied to the comparators U1, U2. In such examples, the sensed output voltage Vout and the ramp signals directly impact the output (the PWM control signals DRIVE_A, DRIVE_B) of the comparators U1, U2. As such, the PWM control signals DRIVE_A, DRIVE_B are generated by the comparators U1, U2 without using conventional error signals and/or error amplifiers.

The PWM control signals DRIVE_A, DRIVE_B may be adjusted for different operating conditions. For example, and as explained above, the duty cycle and/or frequency of the clock signals CLOCK_A, CLOCK_B may be adjusted. As a result, the frequency and/or duty cycle of the PWM control signals DRIVE_A, DRIVE_B generated by the comparators U1, U2 may be adjusted to account for differing operating conditions.

The comparators U1, U2 may be any suitable type of comparator. For example, one or both comparators U1, U2 may be dedicated voltage comparators, operational amplifiers, etc. In some preferred embodiments, the comparators U1, U2 may be fast comparators. In such examples, the comparators U1, U2 may have propagation delay times under about 60 nanoseconds. In some examples, the propagation delay times may range between 38 nanoseconds and 55 nanoseconds. In other examples, the comparators U1, U2 may be slow comparators and have propagation delay times above several hundred nanoseconds.

In some examples, the control circuits disclosed herein may include one or more switching devices for setting the frequency of the generated PWM control signals. For example, the control circuits may include one or more switching devices that are controlled based on the complementary clock signals. In such examples, the switching devices may be employed in conjunction with comparators (e.g., the comparators U1, U2 of FIG. 2) and/or other suitable components that generate the PWM control signals.

Figure 3:
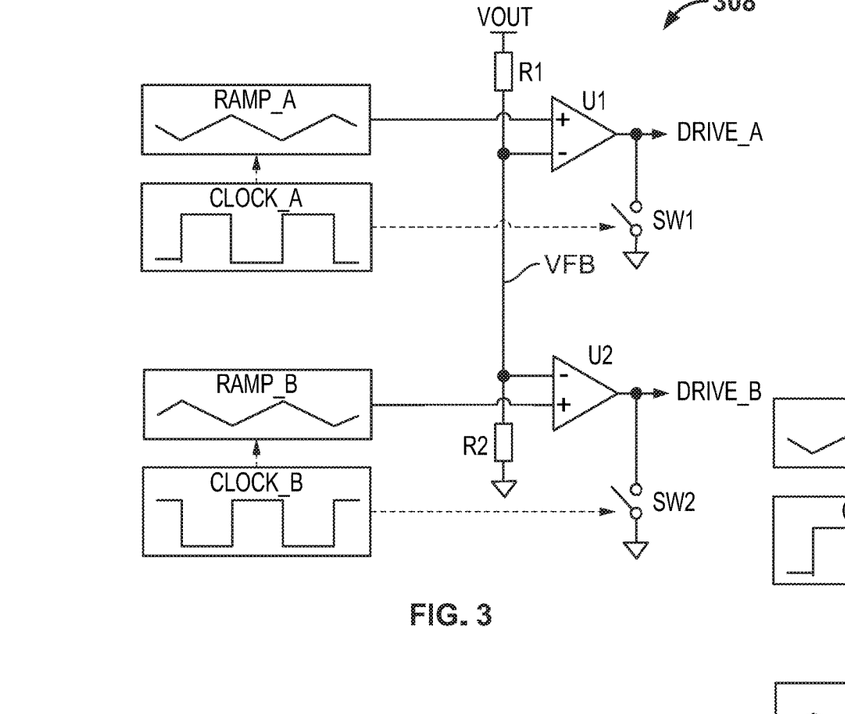
FIG. 3 is a schematic diagram of a control circuit including comparators and switching devices for generating PWM control signals based on ramp signals to control power switching devices in a power circuit according to yet another example embodiment.

For example, FIG. 3 illustrates a control circuit 308 employable with the power circuit 102 of FIG. 1. The control circuit 308 of FIG. 3 is substantially similar to the control circuit 208 of FIG. 2, but includes control switching devices. Specifically, the control circuit 308 includes two control switching devices SW1, SW2, and the comparators U1, U2 of FIG. 2 for generating the PWM control signals DRIVE_A, DRIVE_B based on comparisons between the ramp signals RAMP_A, RAMP_B and the sensed output voltage Vout (e.g., the feedback signal VFB), as explained above. As shown in FIG. 3, the control switching devices SW1, SW2 are coupled to the comparators' outputs. Specifically, the control switching device SW1 is coupled to the output of the comparator U1, and the control switching device SW2 is coupled to the output of the comparator U2.

In the example of FIG. 3, the control circuit 308 may control the frequency of the generated control signals DRIVE_A, DRIVE_B with the control switching devices SW1, SW2. For example, and as shown in FIG. 3, the control circuit 308 controls the switching devices SW1, SW2 with the same clock signals CLOCK_A, CLOCK_B used for generating the ramp signals RAMP_A, RAMP_B (e.g., reference voltage signals). As such, the frequency of the PWM control signals DRIVE_A, DRIVE_B may be directly controlled by the clock signals CLOCK_A, CLOCK_B. As a result, precise fixed-frequency operation may be achieved by the clock-driven switching devices SW1, SW2.

Additionally, the clock signals CLOCK_A, CLOCK_B may be used to control the duty cycles of the PWM control signals DRIVE_A, DRIVE_B. For example, when the clock signal CLOCK_A (or the clock signal CLOCK_B) is high, the switching device SW1 (or the switching device SW2) closes forcing the PWM control signal DRIVE_A (or the PWM control signal DRIVE_B) to a low state. As such, the high times of the clock signals CLOCK_A, CLOCK_B may be used to establish a minimum off time for the PWM control signals DRIVE_A, DRIVE_B. As a result, the duty cycle of the PWM control signals DRIVE_A, DRIVE_B may be maximized. This may be important during start-up and transient conditions, and to prevent saturation of a transformer (if employed in the power circuit).

In some examples, the control circuits disclosed herein may modify the ramp signals prior to generating the PWM control signals. For example, the control circuits may inject the ramp signals onto one or more reference voltages causing the ramp signals to center onto the reference voltage(s). In such examples, the control circuits may generate the PWM control signals based on modified ramp signals (e.g., the ramp signals injected onto the reference voltage(s)).

Figure 4:
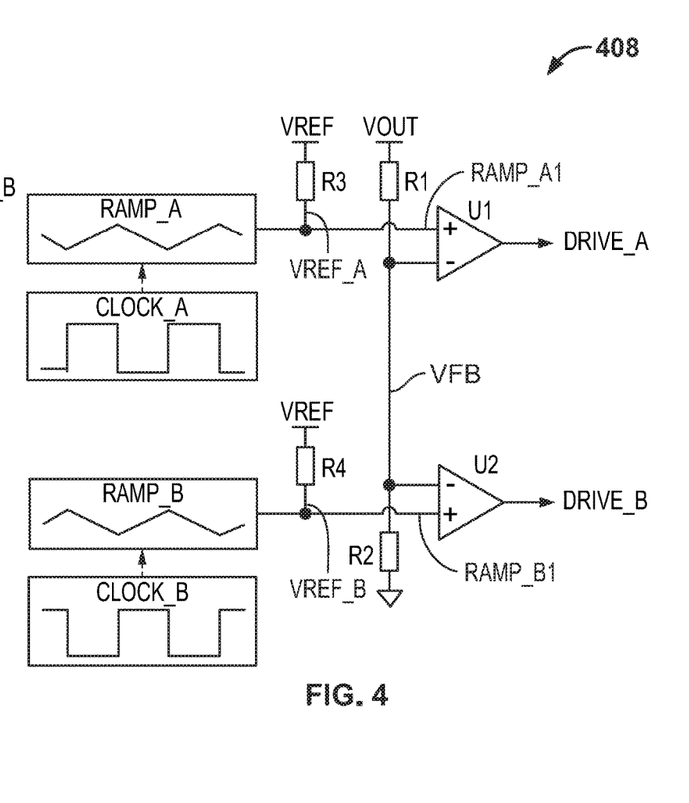
FIG. 4 is a schematic diagram of a control circuit including comparators for generating PWM control signals based on ramp signals and a reference voltage to control power switching devices in a power circuit according to another example embodiment.

For example, FIG. 4 illustrates a control circuit 408 employable with the power circuit 102 of FIG. 1. The control circuit 408 of FIG. 4 is substantially similar to the control circuit 208 of FIG. 2, but includes a reference voltage VREF. Specifically, and as shown in FIG. 4, the control circuit 408 includes the comparators U1, U2 of FIGS. 2 and 3, the reference voltage VREF, and resistors R3, R4 coupled between the reference voltage VREF and the ramp signals RAMP_A, RAMP_B, respectively. The reference voltage VREF is reduced to a reference voltage VREF_A due a voltage drop across the resistor R3, and to a reference voltage VREF_B due a voltage drop across the resistor R4.

In the particular example of FIG. 4, the ramp signals RAMP_A, RAMP_B are injected onto the reference voltages VREF_A, VREF_B, respectively. For example, the ramp signals RAMP_A, RAMP_B are biased by the reference voltages VREF_A, VREF_B causing the ramp signals RAMP_A, RAMP_B to be centered on the reference voltages VREF_A, VREF_B. The biased ramp signals are referred to as modified ramp signals RAMP_A1, RAMP_B1.

As shown in FIG. 4, the comparators U1, U2 generate the PWM control signals DRIVE_A, DRIVE_B based on the modified ramp signals RAMP_A1, RAMP_B1 and the sensed output voltage Vout. Specifically, the comparator U1 compares the modified ramp signal RAMP_A1 and the feedback signal VFB, and generates the PWM control signal DRIVE_A. Likewise, the comparator U2 compares the modified ramp signal RAMP_B1 and the feedback signal VFB, and generates the PWM control signal DRIVE_B. In such examples, the modified ramp signals RAMP_A1, RAMP_B1 function as reference voltage signals for maintaining precise and consistent pulse widths of the generated PWM control signals DRIVE_A, DRIVE, and regulating the output voltage of an associated power circuit (e.g., any one of the power circuits disclosed herein).

The reference voltage VREF and the resistors R3, R4 may be selected and/or adjusted based on desired output regulation. For example, values of the reference voltage VREF and/or the resistors R3, R4 may be selected and/or adjusted to change the modified ramp signals RAMP_A1, RAMP_B1 provided to the comparators U1, U2. As a result, the reference voltage VREF and the resistors R3, R4 may be selected and/or adjusted to achieve precise output regulation control for various control algorithms (e.g., droop current sharing, active current sharing, etc.) and remote voltage sensing.

Figure 5:
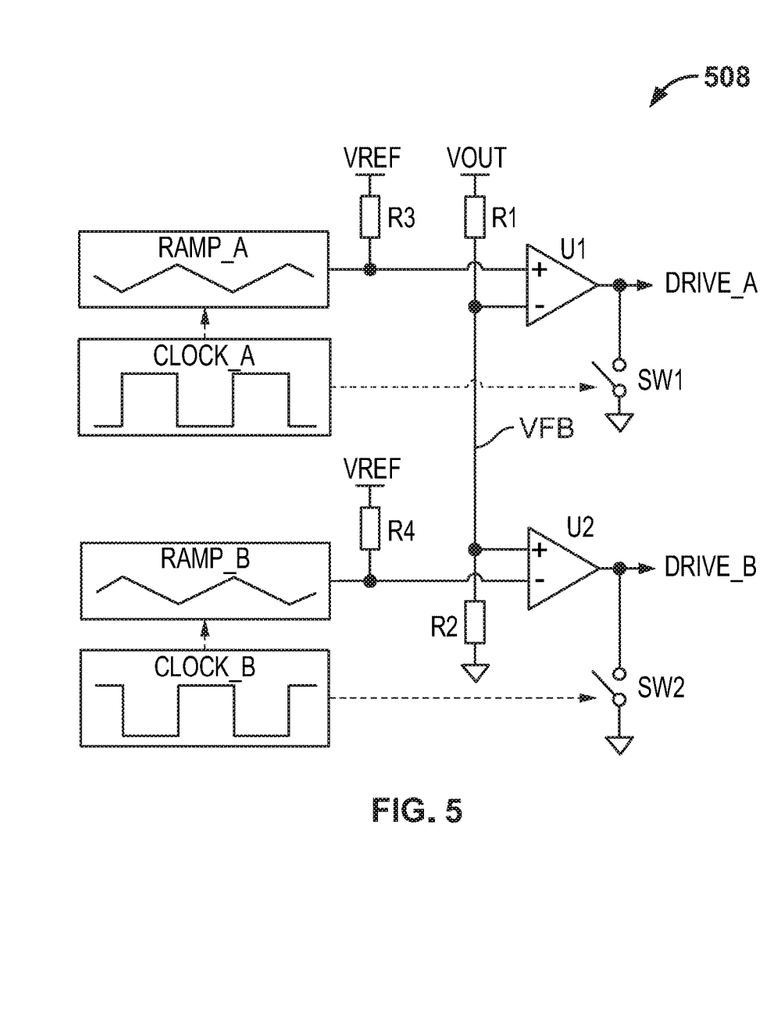
FIG. 5 is a schematic diagram of a control circuit including comparators for generating PWM control signals based on ramp signals and a reference voltage to control power switching devices in a power circuit according to yet another example embodiment.

FIG. 5 illustrates a control circuit 508 employable with the power circuit 102 of FIG. 1. The control circuit 508 of FIG. 5 is substantially similar to the control circuit 408 of FIG. 4, but includes the control switching devices SW1, SW2 of FIG. 3. Specifically, and as shown in FIG. 5, the control circuit 508 includes the comparators U1, U2 of FIGS. 2-4, the reference voltage VREF of FIG. 4, the resistors R3, R4 of FIG. 4, and the control switching devices SW1, SW2 of FIG. 3 coupled to the outputs of the comparators U1, U2. In the example of FIG. 5, the comparators U1, U2 compare the sensed (e.g., sampled) output voltage Vout and the clock-driven ramp signals centered on the reference voltages VREF_A, VREF_B, and generate the PWM control signals DRIVE_A, DRIVE_B, as explained herein. Additionally, the switching devices SW1, SW2 are controlled with the complementary clock signals CLOCK_A, CLOCK_B for setting a fixed frequency of the PWM control signals DRIVE_A, DRIVE_B. As such, precise fixed-frequency and output regulation may be achieved.

Figure 6:
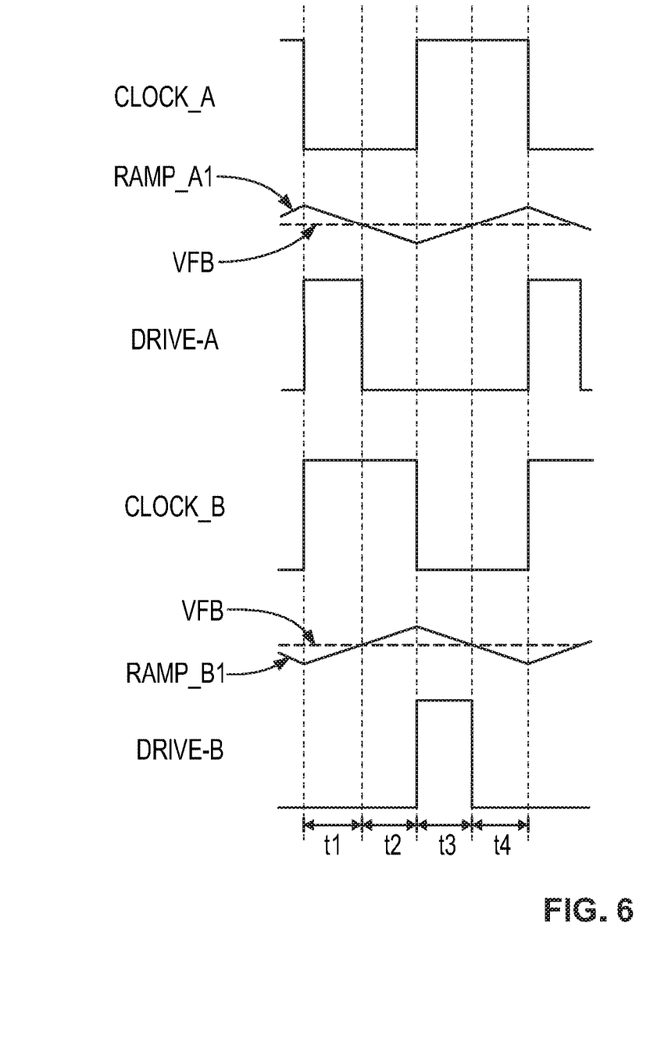
FIG. 6 is a timing diagram of operating waveforms for the comparators of FIG. 5.

FIG. 6 illustrates the operating waveforms of the comparators U1, U2 of FIG. 5 under steady-state conditions. The waveforms are shown over one complete cycle, which is broken into time intervals t1, t2, t3, t4. In the example of FIG. 6, the PWM control signals DRIVE_A, DRIVE_B have the same pulse width and are 180 degrees out of phase.

As shown in FIG. 6, the clock signal CLOCK_A transitions from high to low and the clock signal CLOCK_B transitions from low to high at the start of time interval t1. The high-to-low transition of the clock signal CLOCK_A triggers the beginning of an ON time for the PWM control signal DRIVE_A. During time interval t1, the comparator U1 compares the feedback signal VFB (e.g., the sampled output voltage Vo) to the modified ramp signal RAMP_A1. When the modified ramp signal RAMP_A1 is higher than the feedback signal VFB, the PWM control signal DRIVE_A is high. As such, during time interval t1, switching device(s) controlled by the PWM control signal DRIVE_A are on, and an associated power circuit may delivery power to an output (e.g., a load).

The PWM control signal DRIVE_A remains high until the modified ramp signal RAMP_A1 crosses the feedback signal VFB at time interval t2. For example, once the modified ramp signal RAMP_A1 falls below the feedback signal VFB, the output of the comparator U1 (e.g., the PWM control signal DRIVE_A) changes to a low state. As a result, the switching device(s) controlled by the PWM control signal DRIVE_A turn off. The PWM control signal DRIVE_A remains low until the next high to low transition of the clock signal CLOCK_A at the end of time interval t4.

At time interval t3, the clock signal CLOCK_B transitions from high to low. This clock action triggers the beginning of an ON time for the PWM control signal DRIVE_B. For example, during time interval t3, the comparator U2 compares the feedback signal VFB to the modified ramp signal RAMP_B1. When the modified ramp signal RAMP_B1 is higher than the feedback signal VFB, the PWM control signal DRIVE_B is high. As such, during time interval t3, switching device(s) controlled by the PWM control signal DRIVE_B are on, and an associated power circuit may delivery power to the output.

The PWM control signal DRIVE_B remains high until the modified ramp signal RAMP_B1 crosses the feedback signal VFB at time interval t4. For example, once the modified ramp signal RAMP_B1 falls below the feedback signal VFB, the output of the comparator U2 (e.g., the PWM control signal DRIVE_B) changes to a low state. As a result, the switching device(s) controlled by the PWM control signal DRIVE_B turn off.

Figure 7:
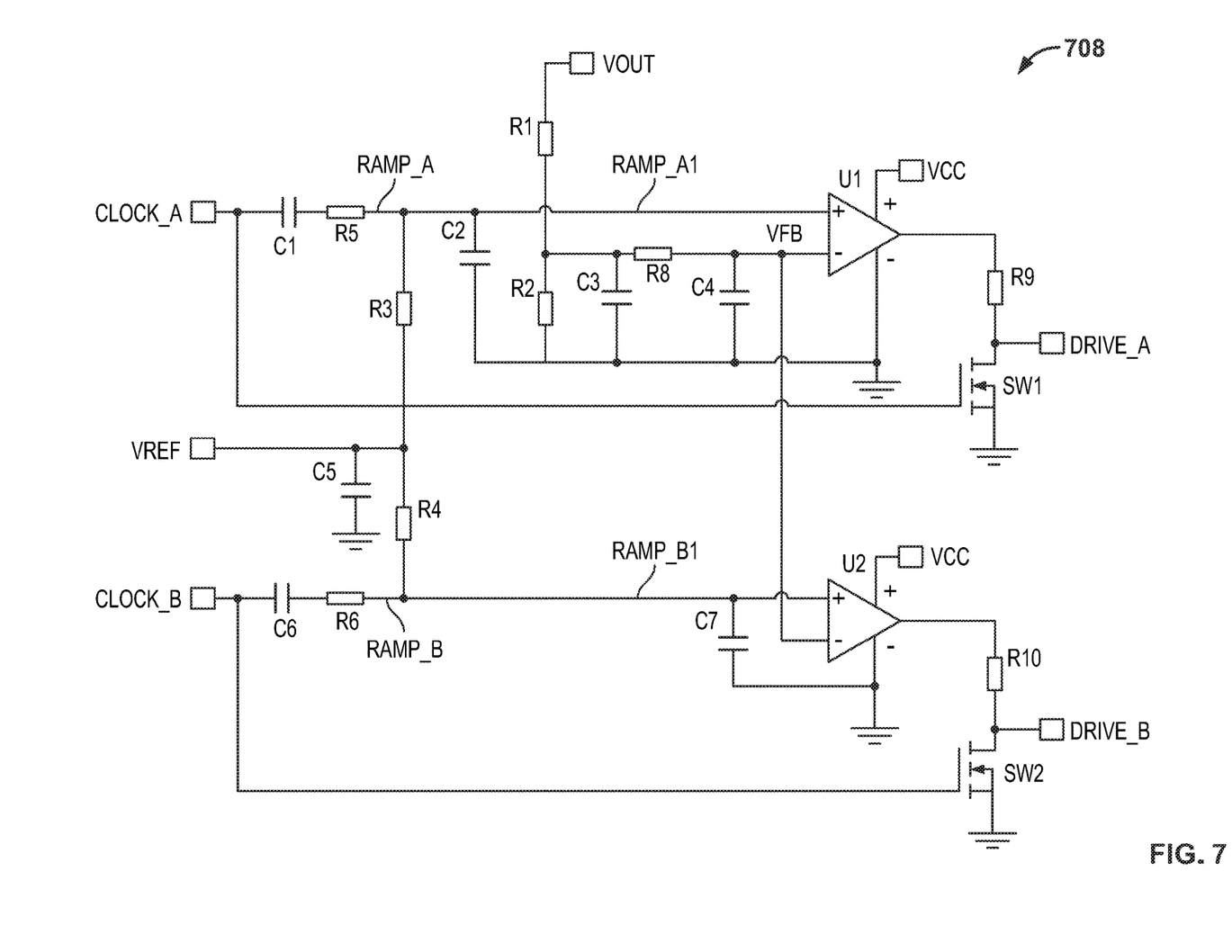
FIG. 7 is a schematic diagram of a control circuit including switching devices controlled based on clock signals for generating PWM control signals to control power switching devices in a power circuit according to another example embodiment.

FIG. 7 illustrates a control circuit 708 similar to the control circuit 508 of FIG. 5, but includes components for generating the ramp signals RAMP_A, RAMP_B. For example, the control circuit 708 of FIG. 7 includes capacitors C1, C6 and resistors R5, R6 in addition to the comparators U1, U2, the control switching devices SW1, SW2 (e.g., shown as MOSFETs), the reference voltage VREF, and the resistors R1-R4 of FIG. 5. The clock signals CLOCK_A, CLOCK_B drive the control switching devices SW1, SW2 as explained above.

The clock signals CLOCK_A, CLOCK_B are coupled to non-inverting inputs of the comparators U1, U2 via RC circuits. The RC circuits generate the ramp signals RAMP_A, RAMP_B. Specifically, the clock signal CLOCK_A is passed through the capacitor C1 and the resistor R5 to generate the ramp signal RAMP_A, and the clock signal CLOCK_B is passed through the capacitor C6 and the resistor R6 to generate the ramp signal RAMP_B.

As shown in FIG. 7, the reference voltage VREF is biasing both non-inverting comparator inputs via the resistors R3, R4. At the same time, the RC circuits (e.g., the resistors R5, R6 and the capacitors C1, C6) superimpose the ramp signals RAMP_A, RAMP_B on the same comparator inputs. This creates the modified ramp signals RAMP_A1, RAMP_B1 at the non-inverting inputs of the comparators U1, U2, as explained above.

Additionally, the control circuit 708 may include optional filtering components for reducing output voltage ripple and maintaining a clean feedback signal VFB. For example, and shown in FIG. 7, the control circuit 708 includes an optional low-pass filtering circuit having capacitors C3, C4 and resistors R2, R8. The resistor R2 and the capacitor C3 provide the first stage of high frequency filtering, and the resistor R8 and the capacitor C4 provide additional filtering.

In some examples, it may be desirable to adjust the reference voltage VREF. As an example, adjustment of the reference voltage VREF may be required for output voltage calibration, current sharing, remote sensing, output voltage trimming, etc. For example, FIG. 8 illustrates a circuit 830 for adjusting the reference voltage VREF of FIGS. 4, 5 and 7.

Figure 8:
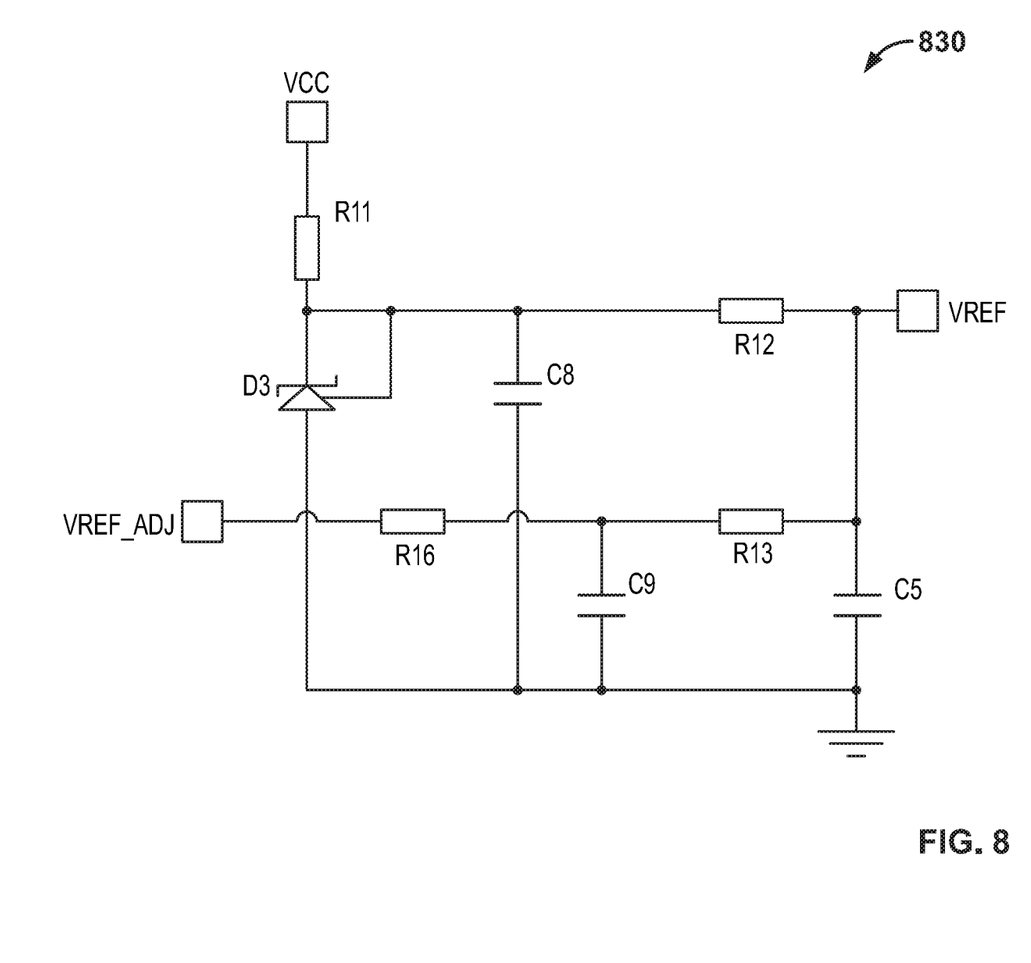
FIG. 8 is a schematic diagram of a circuit for adjusting a reference voltage in the control circuit of FIG. 7, according to yet another example embodiment.

As shown in FIG. 8, the circuit 830 includes resistors R11, R12, R13, R16, capacitors C5, C8, C9, a zener diode D3, and an input VREF_ADJ. In the example of FIG. 8, the input VREF_ADJ may be coupled to a microcontroller (e.g., a PWM output of the microcontroller). The microcontroller may change the duty cycle of a signal at the input VREF_ADJ. This signal may adjust a defined voltage VCC used for setting the reference voltage VREF.

The control circuits disclosed herein may be employed with any suitable converter topology relying on two complimentary control signals (e.g., drive signals). As such, the power circuits disclosed herein may include various different converter topologies including, for example, interleaved two-transistor forward (ITTF) topologies, half-bridge topologies, full-bridge topologies, push-pull topologies, etc. For example, the PWM control signals generated by the control circuits may be used for driving power switching devices in the forward portion of the power circuits when the power switching devices are operated 180 degrees out of phase relative to each other. This may be particularly useful in interleaved topologies. Additionally, the control circuits may be implemented with isolated or non-isolated power converters. For example, the generated control signals may be electrically isolated from their corresponding power circuit(s).

Figure 9:
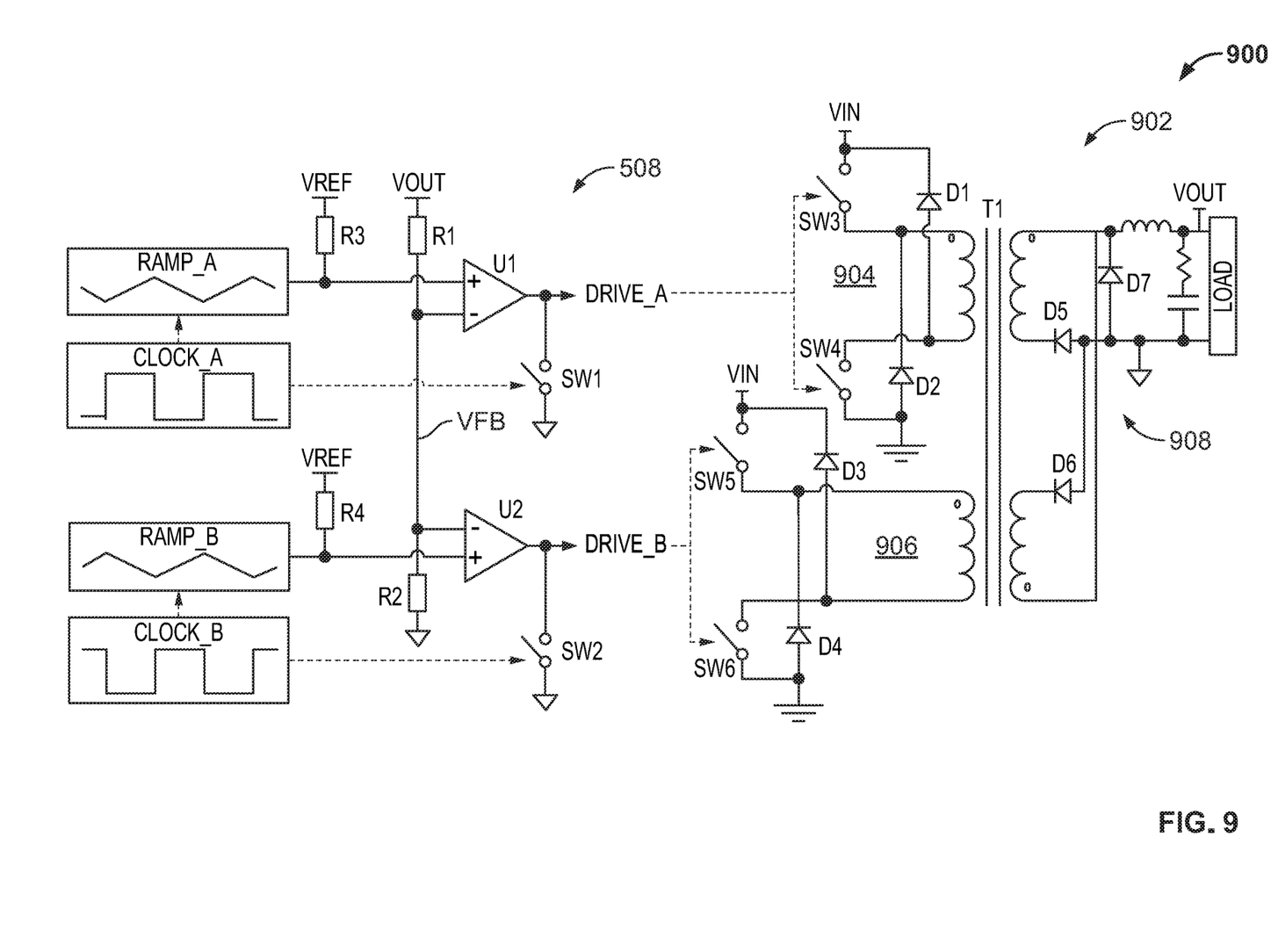
FIG. 9 is a schematic diagram of a switching power converter including an interleaved two-transistor forward topology and the control circuit of FIG. 5 according to another example embodiment.

For example, FIG. 9 illustrates a switching power converter 900 including a power circuit 902 having an ITTF topology, and the control circuit 508 of FIG. 5. As shown in FIG. 9, the power circuit 902 includes a sub-circuit 904 (e.g., one phase) having power switching devices SW3, SW4 and diodes D1, D2 coupled to the power switching devices SW3, SW4, and a sub-circuit 906 (e.g., another phase) having power switching devices SW5, SW6 and diodes D3, D4 coupled to the power switching devices SW5, SW6. In the example of FIG. 9, the power switching devices SW3, SW4 of the sub-circuit 904 are controlled with the PWM control signal DRIVE_A generated by the control circuit 508, and the power switching devices SW5, SW6 of the sub-circuit 906 are controlled with the PWM control signal DRIVE_B generated by the control circuit 508. In other examples, the power switching devices SW3-SW6 may be controlled by PWM control signals generated by any one of the other control circuits disclosed herein.

As shown in FIG. 9, the power circuit 902 further includes a rectifying circuit 908, and a transformer T1 coupled between the rectifying circuit 908 and the sub-circuits 904, 906. The rectifying circuit 908 includes a diode D5 associated with the sub-circuit 904, a diode D6 associated with the sub-circuit 906, and a freewheeling diode D7.

The control circuits disclosed herein may include an analog control circuit, a digital control circuit, or a hybrid control circuit (e.g., a digital control circuit and an analog circuit). The digital control circuits may be implemented with one or more types of digital control circuitry. For example, the digital control circuits each may include a digital controller such as a digital signal controller (DSC), a digital signal processing (DSP), a microcontroller, a field-programmable gate array (FPGA), an application-specific IC (ASIC), etc. As such, any one of the control methods disclosed herein may be at least partially performed by a digital controller.

For example, any one of the control circuits disclosed herein may include a microcontroller and analog control components. In such examples, the microcontroller may be used to generate and/or control the clock signals, the reference voltage VREF, etc. as explained above, and the analog control components (e.g., the comparators, etc.) may be used to generate the control signals based on the clock signals. The analog control components may provide excellent transient response and loop stability characteristics for the control circuit, as further explained below. The microcontroller may provide precise control of the operating frequency by adjusting the frequency and/or duty cycle of the clock signals for various operating conditions as explained above. Additionally, the microcontroller may provide fault protection, assist in soft start and output rise-time control of the power circuits, provide flexibility if power converter operations change, etc.

The teachings disclosed herein may be employed in various power supply applications. For example, the control circuits may be used to control power circuits (e.g., power circuits having ITTF topology) in AC/DC power supplies, DC/DC power supplies, etc. The power supplies may include, for example, 2400 W power supplies, etc. In some examples, the control circuits may be used to control power circuits in server power supply applications.

By employing the control methods disclosed herein, PWM control is achieved based on ramp signals and clock signals to ensure power converters comply with stringent load profiles. As such, design of the control circuits may be simplified while relieving computing stress and reducing power requirements of their microcontrollers. Thus, lower cost microcontrollers having reduced speed may be implemented with the control circuits.

Additionally, the control methods may employ self-compensating techniques by providing a fast feedback path of the sampled output voltage and directly controlling the pulse width and duty cycle of the PWM control signals with the sampled output voltage. As such, control loop compensation (e.g., PID-type control calculations, etc.) that adjusts the control loop to achieve desired characteristics is not required.

The fast feedback path of the sampled output voltage and direct control of the pulse width and duty cycle may provide excellent transient response. For example, when the load steps up from 20 A to 100 A at a slew rate of around 10 A/us, the output voltage may dip for one or two cycles. In such scenarios, the PWM control signals may be adjusted to have a full duty cycle. This causes the output voltage to recover as current ramps up due to the change in the load. Likewise, the PWM control signals may be adjusted to have a lower duty cycle when the load steps down.

Additionally, the transient response may be achieved while maintaining high gain bandwidth and gain/phase margins. Testing has shown that the gain margin remains between 13-15 dB, the phase margin remains between 46-59 degrees, and the gain bandwidth remains between 8-12 kHz when the load changes from 20 A to 190 A. For example, and as shown in Table 1 below, the gain margin is 15 dB, the phase margin is 59 degrees, and the gain bandwidth is 8.73 kHz when the load is 20 A. The gain bandwidth and gain/phase margins are substantially maintained when the load changes. For example, when the load is increased to 100 A, the gain margin is 14.2 dB, the phase margin is 45 degrees, and the gain bandwidth is 9.96, as shown in Table 1. Testing results for loads at 50 A and 190 A are also shown in Table 1.

TABLE 1

| Load (A) | Gain Margin (dB) | Phase Margin (Deg) | Gain Bandwidth (KHz) |
| --- | --- | --- | --- |
| 20 | 15.0 | 59 | 8.73 |
| 50 | 14.5 | 47 | 9.36 |
| 100 | 14.2 | 45 | 9.96 |
| 190 | 13.4 | 46 | 11.75 |

Further, stability of the control circuits may be managed even when it is dependent on the ESR of output capacitors in the power circuits. For example, in a server power supply application, the output capacitor ESR may be sufficiently high to maintain stable operation of the control circuits. For instance, polymer aluminum capacitors having typical ESR values of about 8 m-ohm may be employed. In such examples, excellent transient response and stable loop control may be achieved.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A switching power converter comprising:
   a power circuit including at least two power switching devices, and
   a control circuit coupled to the power circuit for controlling the power switching devices, the control circuit configured to:
      sense an output voltage of the power circuit;
      generate at least two ramp signals based on complementary clock signals;
      generate a first control signal for controlling one of the power switching devices based on one of the ramp signals and the output voltage of the power circuit; and
      generate a second control signal for controlling another one of the power switching devices based on another one of the ramp signals and the output voltage of the power circuit;
   wherein the control circuit includes at least two comparators;
   wherein one of the comparators is configured to generate the first control signal based on a comparison between said one of the ramp signals and the output voltage of the power circuit;
   wherein another one of the comparators is configured to generate the second control signal based on a comparison between said another one of the ramp signals and the output voltage of the power circuit;
   wherein the one of the comparators is configured to generate the first control signal without relying on an error signal; and
   wherein the another one of the comparators is configured to generate the second control signal without relying on an error signal.

2. The switching power converter of claim 1, wherein the control circuit is configured to generate at least two modified ramp signals based on the ramp signals and a reference voltage.

3. The switching power converter of claim 1, wherein the control circuit includes control switching devices, and wherein the control circuit is configured to drive the control switching devices based on the complementary clock signals to set a fixed frequency of the first control signal and the second control signal.

4. The switching power converter of claim 1, wherein the control circuit includes control switching devices, wherein one of the control switching devices is coupled to an output of said one of the comparators, wherein another one of the control switching devices is coupled to an output of said another one of the comparators, and wherein the control circuit is configured to drive the control switching devices based on the complementary clock signals to set a fixed frequency of the first control signal and the second control signal.

5. The switching power converter of claim 1, wherein the power circuit includes an interleaved two-transistor forward topology having a first sub-circuit and a second sub-circuit, wherein said one of the power switching devices is a power switching device in the first sub-circuit, and wherein said another one of the power switching devices is a power switching device in the second sub-circuit.

6. A control circuit for controlling power switching devices of a power circuit, the control circuit including comparators, the control circuit configured to:
sense an output voltage of the power circuit; and
generate at least two ramp signals based on complementary clock signals;
wherein one of the comparators is configured to generate a first control signal for controlling one of the power switching devices based on a comparison between one of the ramp signals and the output voltage of the power circuit;
wherein another one of the comparators is configured to generate a second control signal for controlling another one of the power switching devices based on a comparison between another one of the ramp signals and the output voltage of the power circuit;
wherein the one of the comparators is configured to generate the first control signal without relying on an error signal; and
wherein the another one of the comparators is configured to generate the second control signal without relying on an error signal.

7. The control circuit of claim 6, wherein the control circuit is configured to generate at least two modified ramp signals based on the ramp signals and a reference voltage.

8. The control circuit of claim 6, further comprising control switching devices, one of the control switching devices coupled to an output of said one of the comparators, another one of the control switching devices coupled to an output of said another one of the comparators, and the control circuit configured to drive the control switching devices based on the complementary clock signals to set a fixed frequency of the first control signal and the second control signal.

9. A switching power converter comprising:
a power circuit including at least two power switching devices, and
a control circuit coupled to the power circuit for controlling the power switching devices, the control circuit configured to:
sense an output voltage of the power circuit;
generate at least two ramp signals based on complementary clock signals;
generate a first control signal for controlling one of the power switching devices based on one of the ramp signals and the output voltage of the power circuit; and
generate a second control signal for controlling another one of the power switching devices based on another one of the ramp signals and the output voltage of the power circuit;
wherein the control circuit includes at least two comparators;
wherein one of the comparators is configured to generate the first control signal based on a comparison between said one of the ramp signals and the output voltage of the power circuit;
wherein another one of the comparators is configured to generate the second control signal based on a comparison between said another one of the ramp signals and the output voltage of the power circuit;
wherein the one of the comparators is configured to generate the first control signal without relying on an error amplifier; and
wherein the another one of the comparators is configured to generate the second control signal without relying on an error amplifier.

10. A control circuit for controlling power switching devices of a power circuit, the control circuit including comparators, the control circuit configured to:
sense an output voltage of the power circuit; and
generate at least two ramp signals based on complementary clock signals;
wherein one of the comparators is configured to generate a first control signal for controlling one of the power switching devices based on a comparison between one of the ramp signals and the output voltage of the power circuit;
wherein another one of the comparators is configured to generate a second control signal for controlling another one of the power switching devices based on a comparison between another one of the ramp signals and the output voltage of the power circuit;
wherein the one of the comparators is configured to generate the first control signal without relying on an error amplifier; and
wherein the another one of the comparators is configured to generate the second control signal without relying on an error amplifier.

* * * * *